(12) United States Patent
Fayrushin et al.

(10) Patent No.: US 12,342,544 B2
(45) Date of Patent: Jun. 24, 2025

(54) APPARATUSES INCLUDING BAND OFFSET MATERIALS, AND RELATED MEMORY DEVICES

(71) Applicant: Lodestar Licensing Group, LLC, Evanston, IL (US)

(72) Inventors: Albert Fayrushin, Boise, ID (US); Haitao Liu, Boise, ID (US); Mojtaba Asadirad, Boise, ID (US)

( * ) Notice: Subject to any disclaimer, the term of this patent is extended or adjusted under 35 U.S.C. 154(b) by 0 days.

(21) Appl. No.: 18/365,698

(22) Filed: Aug. 4, 2023

(65) Prior Publication Data
US 2023/0380167 A1 Nov. 23, 2023

Related U.S. Application Data

(60) Division of application No. 17/140,494, filed on Jan. 4, 2021, now Pat. No. 11,778,824, which is a
(Continued)

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02532* (2013.01); *H01L 21/02595* (2013.01);
(Continued)

(58) Field of Classification Search
None
See application file for complete search history.

(56) References Cited

U.S. PATENT DOCUMENTS 5,932,889 A 8/1999 Matsumura et al.
6,313,487 B1 11/2001 Kencke et al.
(Continued)

FOREIGN PATENT DOCUMENTS

CN 105074924 A 5/2017
CN 107431072 A 12/2017
(Continued)

OTHER PUBLICATIONS

Chen et al., Back-Gate Bias Enhanced Band-lo-Band Tunneling Leakage in Scaled MOSFET's, IEEE Electron Device Letters, vol. 19, No. 4, (Apr. 1998), pp. 134-136.
(Continued)

*Primary Examiner* — Sarah K Salerno
(74) *Attorney, Agent, or Firm* — TraskBritt

(57) ABSTRACT

A semiconductor device comprises a stack comprising an alternating sequence of dielectric structures and conductive structures, and a channel structure within an opening vertically extending through the stack and comprising a first semiconductor material having a first band gap. The semiconductor device also comprises a conductive plug structure within the opening and in direct contact with the channel region, and a band offset structure within the opening and in direct physical contact with the channel structure and the conductive plug structure. The band offset structure comprises a second semiconductor material having a second band gap different than the first band gap. The semiconductor device further comprises a conductive line structure electrically coupled to the conductive plug structure. A method of forming a semiconductor device and an electronic system are also described.

18 Claims, 9 Drawing Sheets

Related U.S. Application Data continuation of application No. 16/123,538, filed on Sep. 6, 2018, now Pat. No. 10,923,493.

(51) Int. Cl.

| | | |
|---|---|---|
| *H01L 21/768* | (2006.01) | |
| *H01L 23/522* | (2006.01) | |
| *H01L 23/528* | (2006.01) | |
| *H01L 23/532* | (2006.01) | |
| *H10B 43/30* | (2023.01) | |
| *H10D 62/17* | (2025.01) | |
| *G11C 16/04* | (2006.01) | |
| *G11C 16/10* | (2006.01) | |
| *G11C 16/14* | (2006.01) | |
| *G11C 16/26* | (2006.01) | |

(52) U.S. Cl.
CPC .... *H01L 21/76877* (2013.01); *H01L 23/5226* (2013.01); *H01L 23/528* (2013.01); *H01L 23/53271* (2013.01); *H10B 43/30* (2023.02); *H10D 62/292* (2025.01); *G11C 16/0483* (2013.01); *G11C 16/10* (2013.01); *G11C 16/14* (2013.01); *G11C 16/26* (2013.01); *H01L 21/02546* (2013.01); *H01L 21/0262* (2013.01)

(56) References Cited

U.S. PATENT DOCUMENTS

| | | | |
|---|---|---|---|
| 7,205,604 B2 | 4/2007 | Ouyang et al. | |
| 7,375,375 B2 | 5/2008 | Yamazaki et al. | |
| 7,923,766 B2 | 4/2011 | Saito | |
| 7,936,042 B2 | 5/2011 | Kumar | |
| 8,053,829 B2 | 11/2011 | Kang et al. | |
| 8,119,488 B2 | 2/2012 | Hellings et al. | |
| 8,163,616 B2 | 4/2012 | Kang et al. | |
| 8,278,691 B2 | 10/2012 | Mouli | |
| 8,405,121 B2 | 3/2013 | Gossner et al. | |
| 8,431,961 B2 | 4/2013 | Liu et al. | |
| 8,513,073 B1 | 8/2013 | Basker et al. | |
| 8,729,620 B2 | 5/2014 | Yamazaki et al. | |
| 8,742,481 B2 | 6/2014 | Tessariol et al. | |
| 8,766,320 B2 | 7/2014 | Liu et al. | |
| 8,908,435 B2 | 12/2014 | Li et al. | |
| 8,921,891 B2 | 12/2014 | Liu et al. | |
| 9,177,872 B2 | 11/2015 | Sandhu | |
| 9,209,199 B2 | 12/2015 | Simsek-Ege et al. | |
| 9,281,318 B2 | 3/2016 | Liu et al. | |
| 9,412,821 B2 | 8/2016 | Simsek-Ege et al. | |
| 9,425,299 B1 | 8/2016 | Rabkin et al. | |
| 9,437,604 B2 | 9/2016 | Lu et al. | |
| 9,515,080 B2 | 12/2016 | Takahashi et al. | |
| 9,536,618 B2 | 1/2017 | Zhao et al. | |
| 9,595,534 B2 | 3/2017 | Rhie | |
| 9,673,203 B2 | 6/2017 | Karda et al. | |
| 9,691,819 B2 | 6/2017 | Oh et al. | |
| 9,741,737 B1 | 8/2017 | Huang et al. | |
| 9,761,599 B2 | 9/2017 | Liu et al. | |
| 2012/0299005 A1 | 11/2012 | Lee | |
| 2013/0163336 A1 | 6/2013 | Li et al. | |
| 2016/0049422 A1 | 2/2016 | Kim et al. | |
| 2016/0079261 A1 | 3/2016 | Yamada | |
| 2017/0053986 A1 | 2/2017 | Liu et al. | |
| 2018/0019255 A1 | 1/2018 | Hopkins et al. | |
| 2019/0057975 A1* | 2/2019 | Kim | H10B 41/27 |
| 2020/0144284 A1 | 5/2020 | Choi et al. | |

FOREIGN PATENT DOCUMENTS

| | | |
|---|---|---|
| CN | 105493266 A | 5/2018 |
| CN | 108012566 A | 5/2018 |
| CN | 108140643 A | 6/2018 |

OTHER PUBLICATIONS

Date et al., Suppression of the Floating-Body Effect Using SiGe Layers in Vertical Surrounding-Gate MOSFETs, IEEE Transactions on Electron Devices, vol. 48, No. 12, (Dec. 2001), pp. 2684-2689.
Hong et al., High-Performance SiGe Epitaxial Base Bipolar Transistors Produced by a Reduced-Pressure CVD Reactor, IEEE Electron Device Letters, vol. 14, No. 9, (Sep. 1993), pp. 450-452.
Hwang et al., Vertical Channel ZnO Thin-Film Transistors Using an Atomic Layer Deposition Method, IEEE Electron Device Letters, vol. 5, No. 3, (Mar. 2014), pp. 360-362.
Notice of Allowance for Application No. 201910843545.1, dated May 26, 2021, 7 pages.
Chinese First Office Action for Chinese Application No. 202110891050.3, dated Jul. 14, 2023, 10 pages with translation.

* cited by examiner

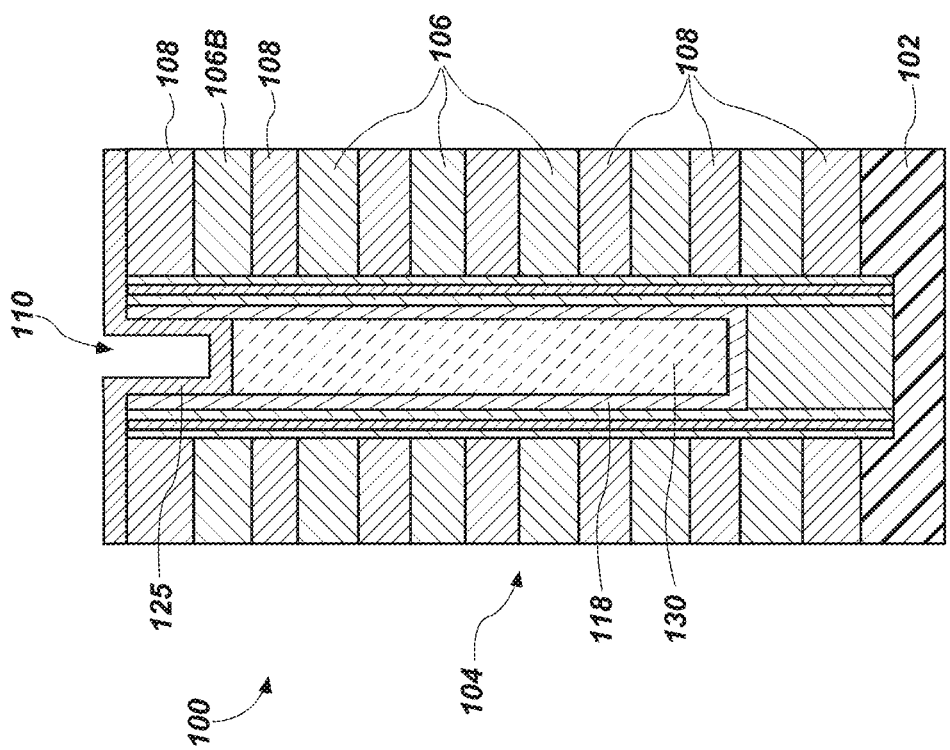
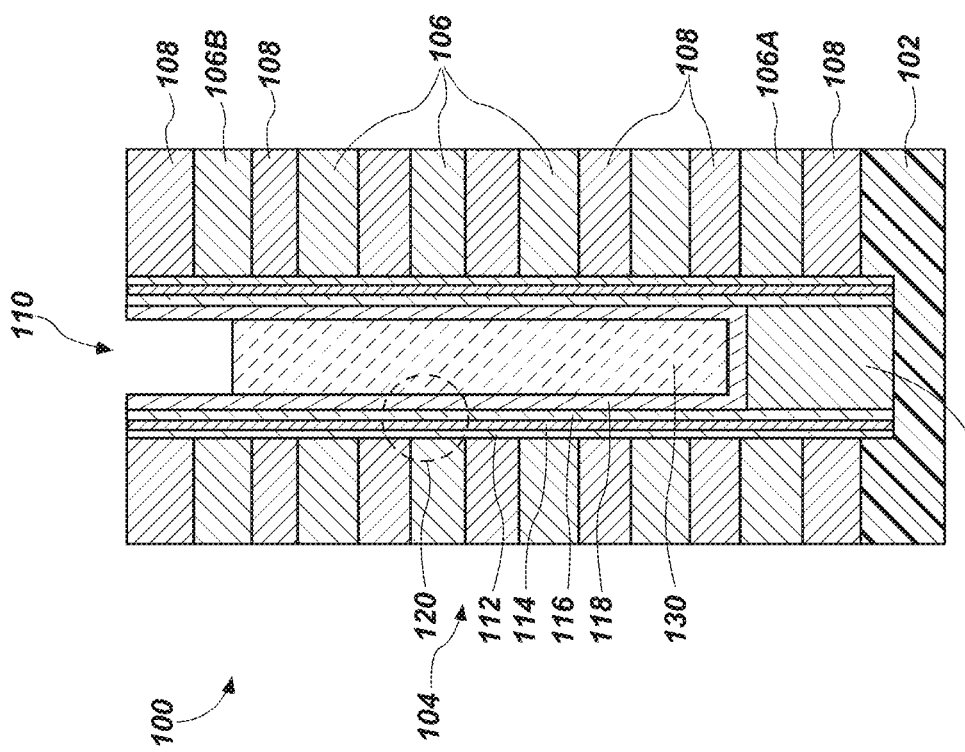
FIG. 1A
FIG. 1B

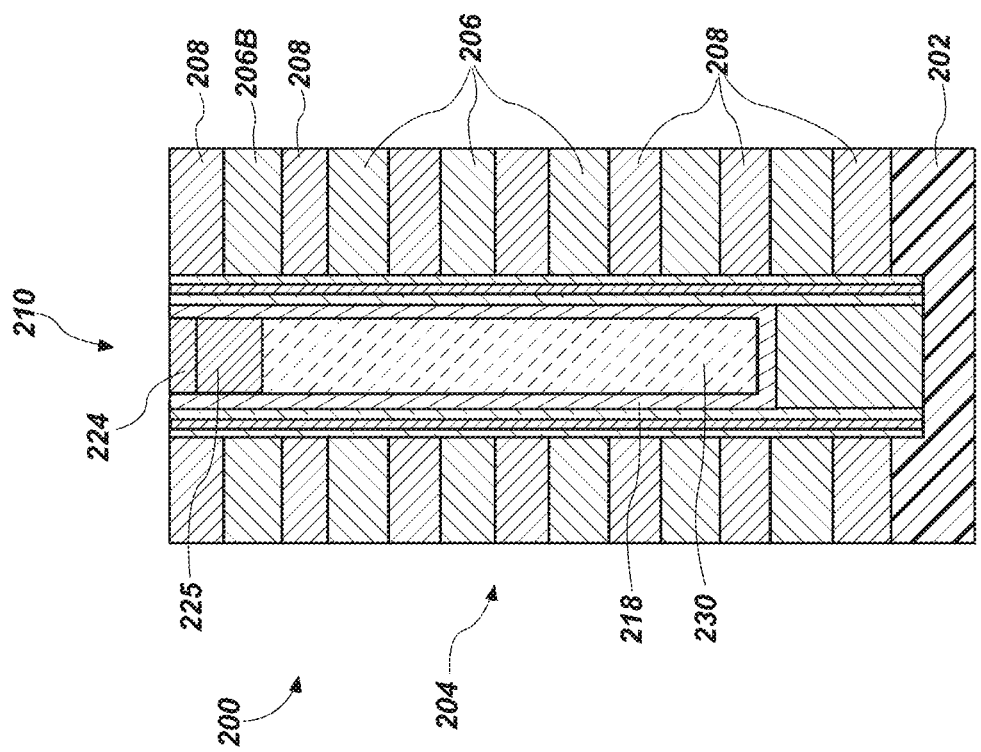
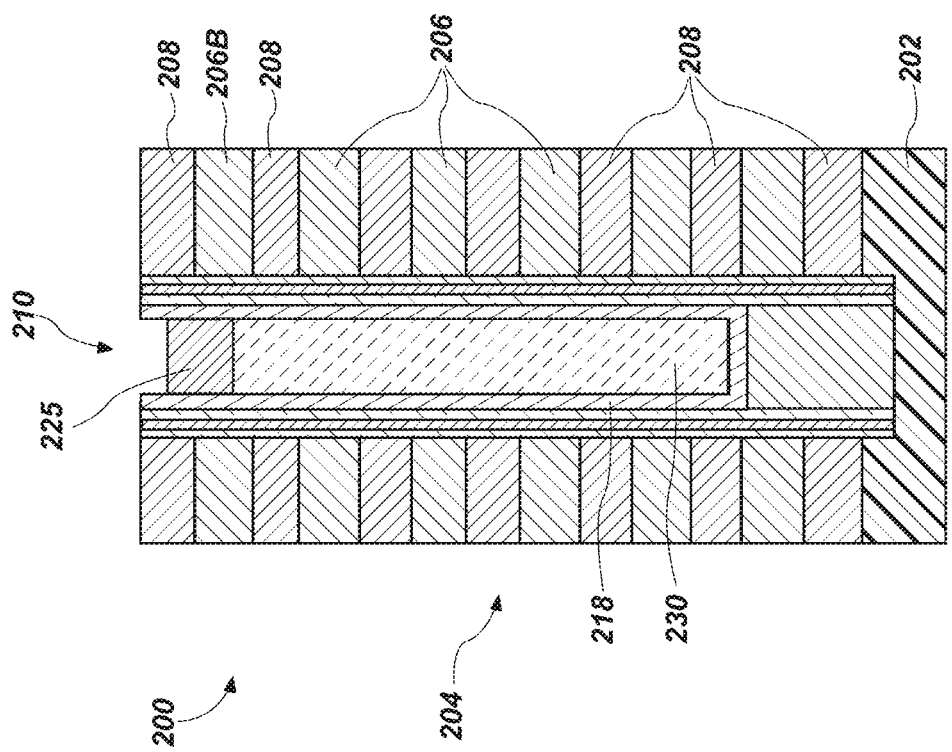

APPARATUSES INCLUDING BAND OFFSET MATERIALS, AND RELATED MEMORY DEVICES

CROSS-REFERENCE TO RELATED APPLICATIONS

This application is a divisional of U.S. patent application Ser. No. 17/140,494, filed Jan. 4, 2021, now U.S. Pat. No. 11,778,824, issued Oct. 3, 2024, which is a continuation of U.S. patent application Ser. No. 16/123,538, filed Sep. 6, 2018, now U.S. Pat. No. 10,923,493, issued Feb. 16, 2021, the disclosure of each of which is hereby incorporated herein in its entirety by this reference.

TECHNICAL FIELD

Embodiments of the disclosure relate to the field of semiconductor device design and fabrication. More specifically, embodiments of the disclosure relate to semiconductor devices including vertical strings of memory cells, and to related electronic systems and methods.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize architectures including arrays of vertical strings of memory cells. An example of a conventional vertical string of memory cells includes a semiconductive material (e.g., a channel material) vertically extending through an opening in a stack of alternating conductive gate materials (e.g., word lines, control gates, access lines) and dielectric materials, and an oxide-nitride-oxide (ONO) structure positioned laterally between the stack and the semiconductive pillar. Each memory cell of the vertical string comprises one of the conductive gate materials and portions of the ONO structure and the semiconductive material laterally-neighboring the one of the conductive gate materials. Such a configuration permits a greater number of memory cells to be located in a given unit of die surface area by building the memory cell arrays upwards (e.g., vertically) on a die, as compared to structures with conventional planar (e.g., two-dimensional) arrangements of cells.

As technology advances in 3D memory devices, arrays of vertical strings of memory cells are being produced and designed with an increased number of alternating conductive gate materials and dielectric materials to increase a number of memory cell access devices (e.g., transistors). This increase results in a stack with a greater height, as well as larger vertical strings of memory cells passing through the stack with the greater height. The semiconductor materials (e.g., channel materials) in the larger vertical strings of memory cells may need to carry an increased current, a so-called "string current," to effectively operate all the memory cells in the vertical string. Whether an increase in the string current is necessary largely depends on band-to-band tunneling ("BTBT") at the select gate drain ("SGD") (e.g., the top select gate near a data line). In addition, conventional polycrystalline silicon (also known as "polysilicon") materials located between the conductive connections (e.g., bit line) and the channel material may result in an insufficient gate-induced drain leakage ("GIDL") current for erase functions on such long vertical memory strings. Accordingly, polysilicon or silicon nitride channel materials alone may not be adequate for generating sufficient GIDL current in a reasonable time frame in stacks having a greater height. Band offset materials, such as low band gap ("LBG") materials located between the conductive connections and the channel materials can effectuate increased GIDL current due to enhanced BTBT generation in order to facilitate erase operations. However, the LBG materials tend to have detrimental effects (e.g., increased defects and traps) resulting in a decreased string current.

Accordingly, there is a need for new semiconductor devices, such as 3D non-volatile memory devices (e.g., 3D NAND Flash memory devices) exhibiting improved GIDL current to facilitate erase operations of the respective vertical memory strings without affecting the string current, as well as for electronic systems including the semiconductor devices.

BRIEF DESCRIPTION OF THE DRAWINGS

FIGS. 1A through 1E are simplified partial cross-sectional views illustrating embodiments of a method of forming a semiconductor device structure, in accordance with embodiments of the disclosure.

FIGS. 2A through 2E are simplified partial cross-sectional views illustrating embodiments of a method of forming a semiconductor device structure, in accordance with additional embodiments of the disclosure.

DETAILED DESCRIPTION

Figure 1D:
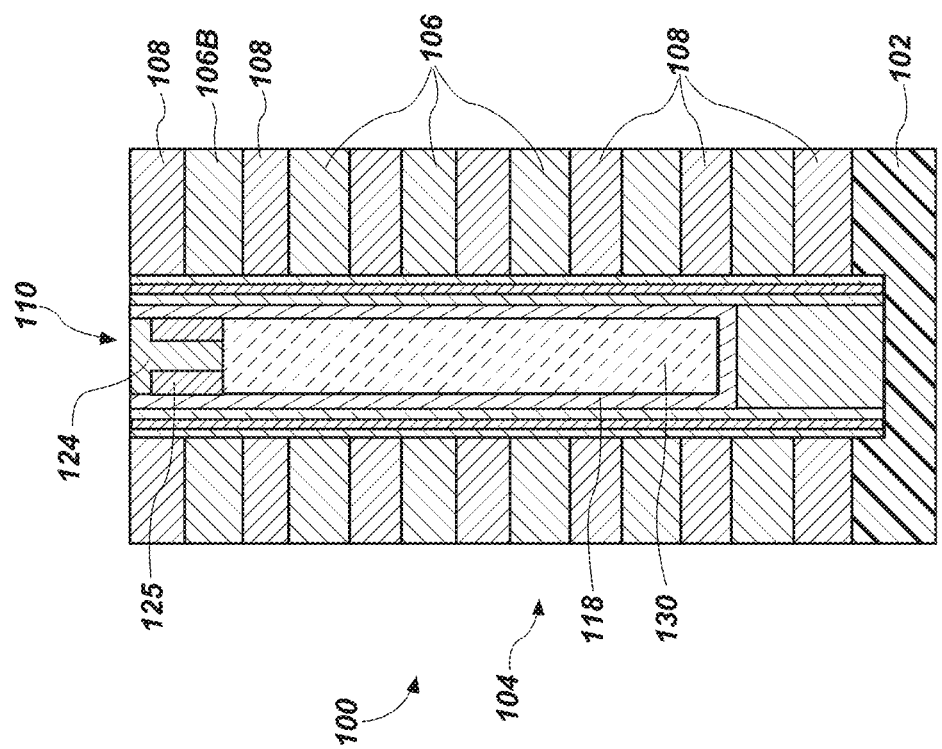

Semiconductor device structures are described, as are related semiconductor devices and electronic systems. In some embodiments, a semiconductor device includes a channel region including a first semiconductor material having a first band gap, a plug region in direct contact with the channel region, a conductive connection electrically coupled to the plug region, and a band offset region including a second semiconductor material having a second band gap different than the first band gap. The band offset region may be in direct contact with each of the channel region and the plug region.

The following description provides specific details, such as material compositions and processing conditions, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional semiconductor fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "forming" and "formed" mean and include any method of creating, building, depositing, and/or patterning a material. For example, forming may be accomplished by atomic layer deposition (ALD), chemical vapor deposition (CVD), physical vapor deposition (PVD), sputtering, co-sputtering, spin-coating, diffusing, depositing, growing, or any other technique known in the art of semiconductor fabrication. Material may be formed and/or patterned into various shapes and configurations using known techniques, such as isotropic etching, anisotropic etching, chemical-mechanical polishing (CMP), ablating, etc. Depending on the specific material to be formed, the technique for forming the material may be selected by a person of ordinary skill in the art.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., via another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

FIGS. 1A through 1E illustrate a method of forming a semiconductor device structure including openings of memory cells, at various stages of the method, according to an embodiment of this disclosure. For simplicity, the formation of single openings of memory cells is illustrated, but will be understood by one of ordinary skill in the art that the method may include simultaneously forming multiple (e.g., more than one, an array of) openings of memory cells.

Referring to FIG. 1A, a semiconductor device structure 100 includes a stack 104 of alternating tiers of conductive gate materials 106 and dielectric materials 108 overlying a substrate 102 (e.g., a conductive line, such as a source line). An opening 110 may vertically extend through the stack 104. An outer oxide liner 112 may be formed laterally adjacent sidewalls of the stack 104 within the opening 110. A nitride liner 114 may be formed inwardly laterally adjacent to the outer oxide liner 112 within the opening 110. An inner oxide liner 116 may be formed inwardly laterally adjacent to the nitride liner 114 within the opening 110. A channel material 118 may be formed inwardly laterally adjacent to the inner oxide liner 116 within the opening 110. In some embodiments, the channel material 118 may comprise a liner having a thickness less than about 25 nm, such as within a range of from about 5 nm to about 20 nm. The channel material 118 may or may not exhibit a substantially homogeneous distribution of the elements thereof. A bottom plug material 122 (e.g., a source contact plug material) may be formed between the substrate 102 and the channel material 118 within the opening 110. The channel material 118 may be formed along internal sidewalls of the inner oxide liner 116 and over an exposed upper surface of the bottom plug material 122, as illustrated in FIG. 1A. The bottom plug material 122 may extend upward from the substrate 102 to at least partially vertically overlap a lowermost conductive gate material 106A. An uppermost conductive gate material 106B may be formed remote from the lowermost conductive gate material 106A and proximate an upper surface of the stack 104. A central dielectric material 130 may be formed adjacent to a channel material 118 within the opening 110. An upper surface of the central dielectric material 130 may be lower than a lower surface of the uppermost conductive gate material 106B. The central dielectric material 130 may be or include, for example, an oxide material or an air-filled void.

The alternating conductive gate materials 106 and the dielectric materials 108 of the stack 104 may each individually be formed using conventional material processes, which are not described in detail herein. As a non-limiting example, the conductive gate materials 106 and the dielectric materials 108 may each individually be formed through one or more conventional deposition processes (e.g., a PVD process, a CVD process, ALD process, a spin-coating process) to form the stack 104. As another non-limiting example, an initial stack comprising a vertically alternating sequence of sacrificial dielectric materials and the dielectric material formed through conventional processes (e.g., conventional deposition processes, such as one or more of PVD, CVD, and ALD), and then portions of sacrificial dielectric materials are removed and replaced with the conductive gate materials 106 to form the stack 104 through a so-called "replacement gate" process. To remove the sacrificial dielectric materials, one or more slots may be formed through the initial stack to laterally expose the sacrificial dielectric materials, an isotropic etch may be performed to selectively remove portions of sacrificial dielectric materials and form gaps (e.g., undercuts) between the dielectric materials 108, and then a conductive material (e.g., one or more of titanium, titanium nitride, tantalum, tantalum nitride, tungsten, or tungsten nitride) may be deposited within the gaps to form the conductive gate materials 106.

With continued reference to FIG. 1A, an individual (e.g., single, one) conductive gate material 106 of the stack 104, and portions of the outer oxide liner 112, nitride liner 114, inner oxide liner 116, and channel material 118 laterally-neighboring the individual conductive gate material 106 may form an individual a vertical memory cell 120 having a so-called metal-oxide-nitride-oxide-semiconductor ("MONOS") configuration. In turn, a vertical stack of multiple (e.g., more than one) vertical memory cells 120 within the opening 110 may form a vertical string (e.g., vertical series) of the memory cells 120. The channel material 118 may be undoped, or may include a p-type dopant or an n-type dopant.

Referring next to FIG. 1B, a band offset material 125 may be formed (e.g., conformally formed) over exposed surfaces (e.g., exposed upper surfaces, exposed side surfaces) of the semiconductor device structure 100 inside and outside of the opening 110. The band offset material 125 may be in direct contact with and electrically coupled to the channel material 118. In some embodiments, the band offset material 125 may be in direct physical contact with the channel material 118 along a single interface, for example, along a vertical interface therebetween. By way of example and not limitation, the band offset material 125 may comprise one or more of silicon germanium (which has a room temperature band bap of about 0.85 eV), germanium (which has a room temperature band gap of about 0.66 eV), and indium gallium arsenide (which has a room temperature band gap of about 0.7 eV). In some embodiments, the band offset material 125 may include a p-type dopant. In other embodiments, the band offset material 125 may be undoped. As described in further detail below, a band gap of the band offset material 125 may be different than (e.g., lower than) a band gap of the channel material 118. The band offset material 125 may be formed by a conformal deposition process, such as CVD or ALD. The band offset material 125 may alternatively be epitaxially grown within the opening 110.

Figure 1C:
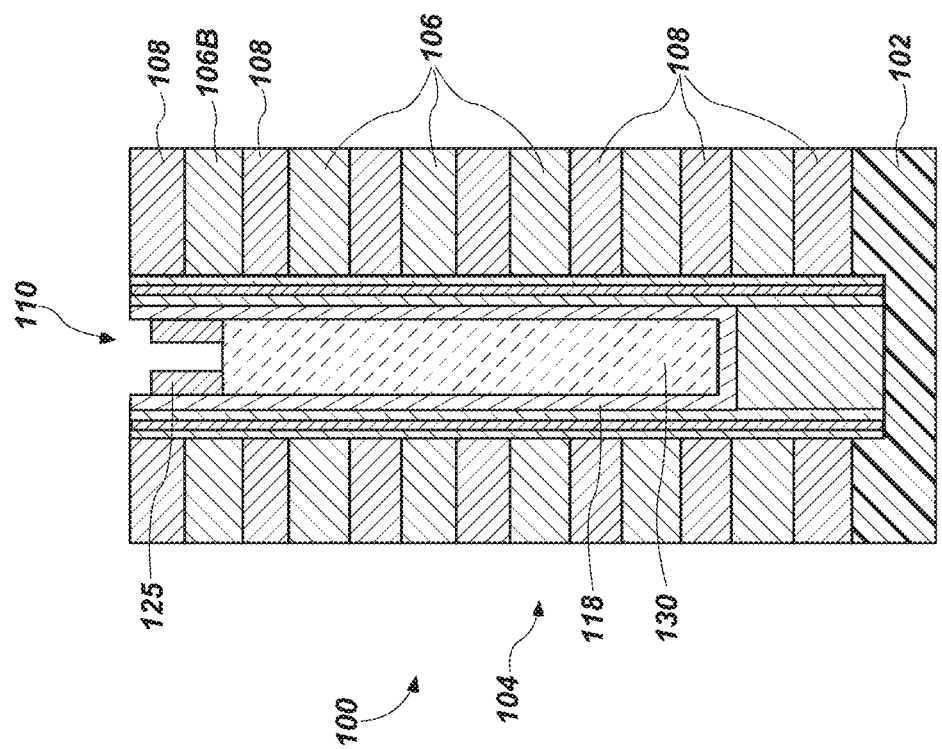

Referring to FIG. 1C, portions of the band offset material 125 outside of the opening 110 and over at least a central portion of an upper surface of the central dielectric material 130 within the opening 110 may be selectively removed, such as by etching. Uppermost surfaces of remaining portions of the band offset material 125 within the opening 110 may be below an uppermost surface of the stack 104 and may be above an upper surface of the uppermost conductive gate material 106B. In addition, the remaining portions of the band offset material 125 may be positioned such that lower surfaces thereof extend beyond a lower surface of the uppermost conductive gate material 106B. The band offset material 125 may at least partially (e.g., substantially) vertically overlap the uppermost conductive gate material 106B.

Referring next to FIG. 1D, a top plug material 124 (e.g., a drain contact plug material) may be formed within and fill a remainder of the opening 110. The top plug material 124 may be electrically coupled to the channel material 118. The top plug material 124 may comprise a semiconductor material, such as one or more of polysilicon, silicon germanium, and germanium. The top plug material 124 may be conductively doped. By way of non-limiting example, the top plug material 124 may include a first concentration of an n-type dopant and the channel material 118 may include a second concentration of an n-type dopant that is relatively lower than the first concentration. The process for forming the top plug material 124 may be, for example, CVD or ALD. A band gap of the top plug material 124 may be different than (e.g., larger than) a band gap of the band offset material 125. By way of example and not limitation, the top plug material 124 and/or the channel material 118 may exhibit a room temperature band gap of at least about 1.40 eV, and the band offset material 125 may exhibit a room temperature band gap of less than about 1.10 eV. Forming the band offset material 125 from a material that exhibits a band gap of less than about 1.10 eV may increase a gate-induced drain leakage ("GIDL") current in vertical string erase operations of a resulting device (e.g., a memory device) compared to only providing the top plug material 124 exhibiting a larger band gap. In other embodiments, a band gap of the top plug material 124 may be smaller than a band gap of the band offset material 125. In such embodiments, for example, the top plug material 124 may include germanium-containing materials, while the band offset material 125 includes one or more larger band gap materials, such as polysilicon. The band gap of the top plug material 124 may be similar to (e.g., substantially the same as) a band gap of the channel material 118.

The top plug material 124 may initially be formed over an upper surface of the stack 104, in addition to within the opening 110. Portions of the top plug material 124 vertically extending beyond a plane of the upper surface of the stack 104 may subsequently be removed, such as by CMP or etching. Remaining portions of the top plug material 124 may be in direct physical contact with and electrically coupled to each of the band offset material 125 and the channel material 118. For example, portions of the top plug material 124 may vertically overlie and be in direct physical contact with upper and side surfaces of the remaining portions of the band offset material 125 while being adjacent to, inside, and in direct physical contact with a sidewall of the channel material 118. In such embodiments, the top plug material 124 may include a lower portion and an upper portion having a greater radial extent than the lower portion thereof, while the band offset material 125 may be radially adjacent (e.g., laterally surrounding) the lower portion of the top plug material 124. In addition, a side surface of the upper portion of the top plug material 124 may be in direct physical contact with the channel material 118 and a bottom surface of the lower portion of the top plug material 124 may be in direct physical contact with the central dielectric material 130. In other embodiments, a remaining portion of the top plug material 124 vertically overlies a portion of the channel material 118.

The uppermost conductive gate material 106B may have a vertical thickness TL that is greater than respective thicknesses of the other conductive gate materials 106 of the stack 104. The relatively greater vertical thickness TL of the uppermost conductive gate material 106B may facilitate a relatively larger error margin when forming a combined extent of the band offset material 125 and the top plug material 124 to at least partially vertically overlap the uppermost conductive gate material 106B. By way of example and not limitation, the vertical thickness TL of the uppermost conductive gate material 106B may be greater than or equal to about 45 nm, while the respective vertical thicknesses of the other conductive gate materials 106 may be about 35 nm.

Figure 1E:
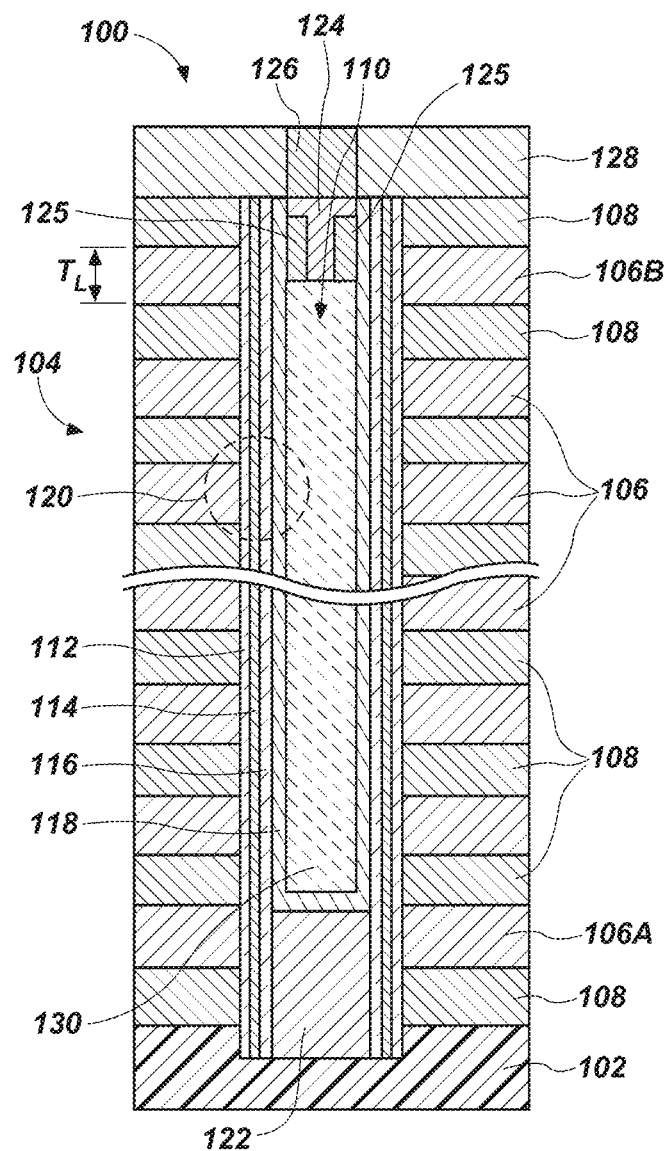

Referring to FIG. 1E, a cap dielectric material 128 may be formed on or over upper surfaces of the stack 104, the outer oxide liner 112, the nitride liner 114, and the inner oxide liner 116; and a data line 126 (e.g., bit line, digit line) may be formed on or over uppermost surfaces of the top plug material 124. The cap dielectric material 128 may include one or more dielectric materials, such as one or more of a silicon oxide (e.g., silicon dioxide) and silicon nitride. The data line 126 may provide electrical access to the vertical string of memory cells 120 without being in direct physical contact with the band offset material 125, and without being electrically coupled to the band offset material 125.

The cap dielectric material 128 and the data line 126 may be formed using conventional processes (e.g., conventional deposition processes, conventional material removal processes) and conventional processing equipment, which are not described in detail herein. For example, the cap dielectric material 128 may be deposited (e.g., through one or more of CVD, PVD, ALD, spin-coating) over upper surfaces of the upper surfaces of the stack 104, the outer oxide liner 112, the nitride liner 114, and the inner oxide liner 116, and the top plug material 124; portions of the cap dielectric material 128 overlying the top plug material 124 may be removed (e.g., through a conventional photolithographic patterning and etching process) to form a plug opening overlying the top plug material 124; a conductive material (e.g., tungsten, tungsten nitride, titanium, titanium nitride) may be deposited into the plug opening; and the portions of the conductive material may be removed (e.g., through a CMP process) to form the data lines 126. The data lines 126 may laterally extend perpendicular to the conductive gate materials 106 of the stack 104.

With continued reference to FIG. 1E, the band offset material 125 and the top plug material 124 may be located between the channel material 118 and a data line 126 (e.g., a bit line). One or more of the top plug material 124 and the band offset material 125 may at least partially vertically overlap the uppermost conductive gate material 106B. One or more (e.g., from one to five) of the lowermost conductive gate materials 106, 106A may be configured as select gate sources ("SGSs"). One or more (e.g., from one to five) of the uppermost conductive gate materials 106, 106B may be configured as select gate drains ("SGDs"). The conductive gate materials 106 between the select gate source(s) and the select gate drain(s) may be configured as access lines (e.g., word lines). There may be any suitable number of access lines in the stack 104, such as about 32, about 64, about 72, about 96, or about 128, for example. As shown in FIG. 1E, the opening 110 may comprise a linear, elongated opening (e.g., aperture, via) exhibiting one end at an uppermost surface of the stack 104 and another end at a lowermost surface of the stack 104. In additional embodiments, the opening 110 may exhibit a so-called "U-shaped" configuration having a pair of ends at the uppermost surface of the stack 104.

Thus, in accordance with embodiments of the disclosure, a semiconductor device comprises a stack comprising an alternating sequence of dielectric structures and conductive structures, a channel structure within an opening vertically extending through the stack and comprising a first semiconductor material having a first band gap. The semiconductor device also comprises a conductive plug structure within the opening and in direct contact with the channel region, and a band offset structure within the opening and in direct physical contact with the channel structure and the conductive plug structure. The band offset structure comprises a second semiconductor material having a second band gap different than the first band gap. The semiconductor device further comprises a conductive line structure electrically coupled to the conductive plug structure.

Moreover, in accordance with embodiments of the disclosure, a method of forming a semiconductor device comprises forming an opening vertically extending through a stack of alternating conductive gate materials and dielectric materials. The method comprises forming a channel material within the opening. The method also comprises forming a band offset material within the opening and adjacent to the channel material. The method further comprises forming a plug material within the opening and electrically coupled to the channel material. The band offset material is electrically coupled to the channel material and the plug material, and a band gap of the band offset material is different than that of each of the channel material and the plug material.

Figure 1F:
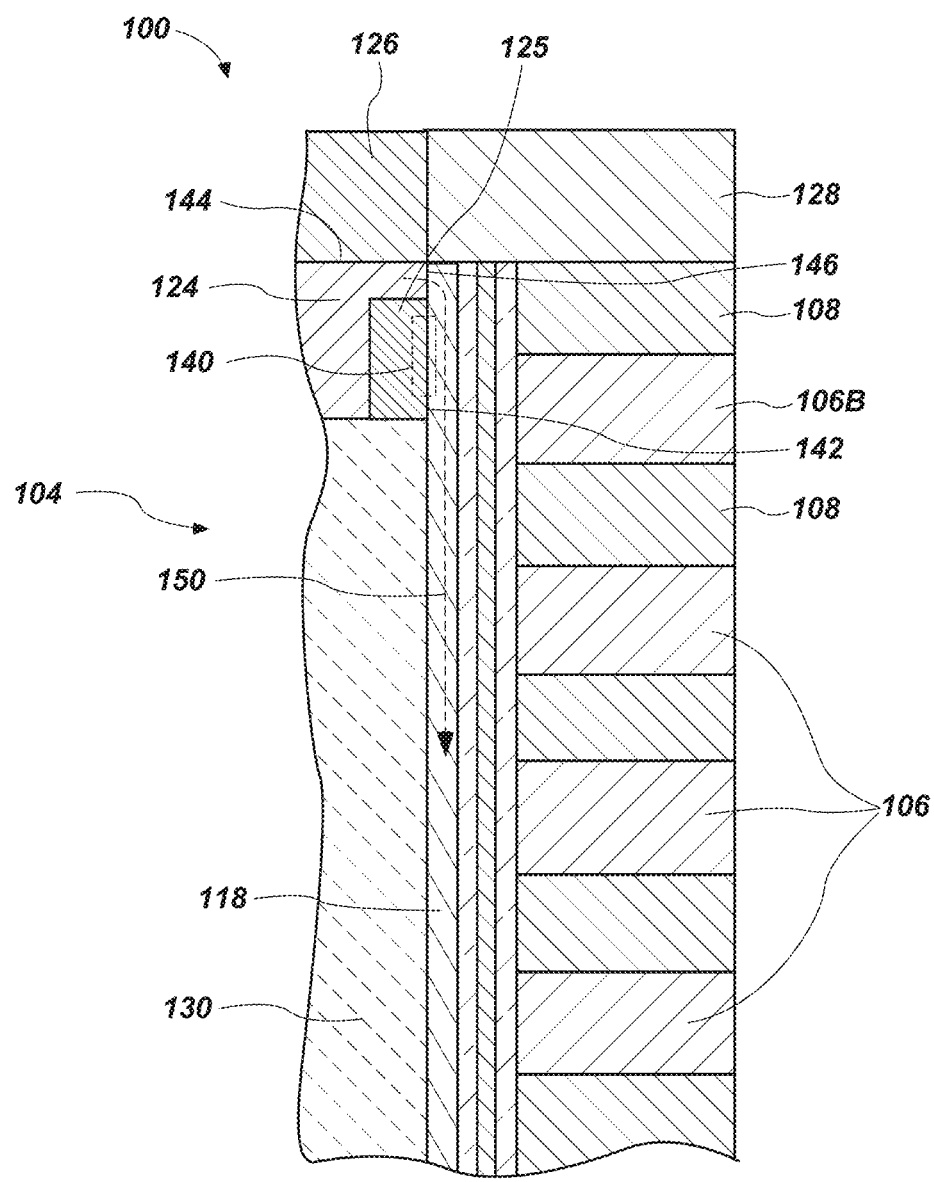
FIG. 1F is a simplified partial cross-sectional side view of a portion of a vertical string of memory cells of the semiconductor device structure of FIG. 1E.

FIG. 1F shows a simplified partial cross-sectional side view of a portion of the semiconductor device structure 100 shown in FIG. 1E. As shown in FIG. 1F, the data line 126 and the top plug material 124 may be coupled to one another along an interface 144. In addition, the top plug material 124 and the channel material 118 may be coupled to one another along an interface 146. The interface 146 may be a so-called "homojunction" wherein the materials of the top plug material 124 and the channel material 118 are substantially similar (e.g., the same) and, thus, exhibit similar (e.g., equal) band gaps on each side of the interface 146. By way of example and not limitation, each of the top plug material 124 and the channel material 118 may include a polycrystalline silicon (also known as "polysilicon") material exhibiting substantially equal band gaps. Alternatively, the channel material 118 may include a nitride (e.g., silicon nitride) material. Moreover, the band offset material 125 and the channel material 118 may be coupled to one another along an interface 142. The interface 142 may be a so-called "heterojunction" wherein the materials of the band offset material 125 and the channel material 118 are different and/or exhibit one or more of different dopant concentrations and different dopant distributions. As such, the band offset material 125 and the channel material 118 may have different (e.g., unequal) band gaps than one another.

During operation, electrical current may flow between the materials (e.g., polysilicon materials) of the top plug material 124 and the channel material 118, while flowing proximate to, but outside of, a region containing materials (e.g., silicon germanium or germanium materials) of the band offset material 125 due to such a region exhibiting a different (e.g., smaller) band gap. One of ordinary skill in the art will appreciate that providing a current path between the homojunction of interface 146, while not providing a current path through the heterojunction of interface 142 may be based on the adjacent regions of the interface 142 having one or more of differing materials, differing dopant species, differing dopant concentrations, and differing dopant distributions. Providing the band offset material 125 proximate to, while located outside, the current path provides increased surface area along the interface 142, which allows a greater cross-sectional area to generate GIDL current. Stated another way, an orientation (e.g., vertical orientation) of the interface 142 provides an expanded region in which to generate GIDL-induced holes for block erase of memory cells, as opposed to a transverse orientation (e.g., horizontal orientation) of an area within the channel material 118, which area is limited by a width of the channel material 118.

During operation of the semiconductor device structure 100, electrical current may be applied to the data line 126, establishing a flow of electrical current (e.g., string current) through at least a portion of the top plug material 124 and to the channel material 118, as shown by a dashed, directional arrow 150 in FIG. 1F. In some embodiments, the electrical current does not flow through the band offset material 125 due, at least in part, to the band offset material 125 having a different (e.g., smaller) band gap. As the current flows from the data line 126 to the channel material 118 through the top plug material 124, a generation region 140 may be established along the interface 142 located between the band offset material 125 and the channel material 118. As the electrical current flows proximate the interface 142, while bypassing the band offset material 125 during GIDL mode, band-to-band tunneling ("BTBT") may be generated (e.g., enhanced) in the generation region 140 located along the interface 142. Since the electrical current flows proximate to, but outside, the band offset material 125, the flow of electrical current is not reduced (e.g., diminished) during a sensing operation. Stated another way, the electrical current may flow from the data line 126 through the top plug material 124 without flowing through the band offset material 125. Thus, BTBT may be established or increased due, at least in part, to the band offset material 125 having a different band gap than that of each of the top plug material 124 and the channel material 118, without decreasing the electrical current supplied to the vertical string of memory cells 120 (FIG. 1E). The increased GIDL current allows more reliable charge flow into the channel material 118 to bias a body region of individual memory cells 120. A reliable bias voltage is desirable in a number of memory operations, such as erase operations, where large voltage differences are used.

During a programming operation, the channel material 118 of non-selected strings may be biased using a boost operation to inhibit the charge storage structures of the non-selected strings from being erased in memory cells 120 (FIG. 1E) that are not selected for an erase operation. In a boost operation, a voltage may be applied to the channel material 118, at least in part, through capacitive coupling of the channel material 118 to an applied voltage on respective gates of individual memory cells 120. For example, a voltage (e.g., about 10 volts) may be placed on the gates, and some amount of that bias voltage (e.g., about 7 volts) may be transferred to the channel material 118 through coupling. In some embodiments, the applied voltage may be a negative voltage, for example, applied to the uppermost conductive gate material 106B. Using a boost operation, charge may be maintained within the channel material 118. As a result, a low GIDL current is desirable during a boost operation. Thus, using materials having differing band gaps, as described above, may provide reliable biasing of the channel material 118 during an erase operation, and may also provide reliable charge maintenance in the channel material 118 during a boost operation.

One of ordinary skill in the art will appreciate that, in accordance with additional embodiments of the disclosure, the features and feature configurations described above in relation to FIGS. 1A through 1F may be readily adapted to the design needs of different semiconductor devices (e.g., different memory devices). By way of non-limiting example, in accordance with additional embodiments of the disclosure, FIGS. 2A through 2E show simplified, partial cross-sectional views of a method of forming a semiconductor device structure having a different configuration than the semiconductor device structure 100. Throughout the remaining description and the accompanying figures, functionally similar features (e.g., structures, devices) are referred to with similar reference numerals incremented by 100. To avoid repetition, not all features shown in the remaining figures (including FIGS. 2A through 2E) are described in detail herein. Rather, unless described otherwise below, a feature designated by a reference numeral that is a 100 increment of the reference numeral of a previously-described feature (whether the previously-described feature is first described before the present paragraph, or is first described after the present paragraph) will be understood to be substantially similar to the previously-described feature.

Figure 2B:
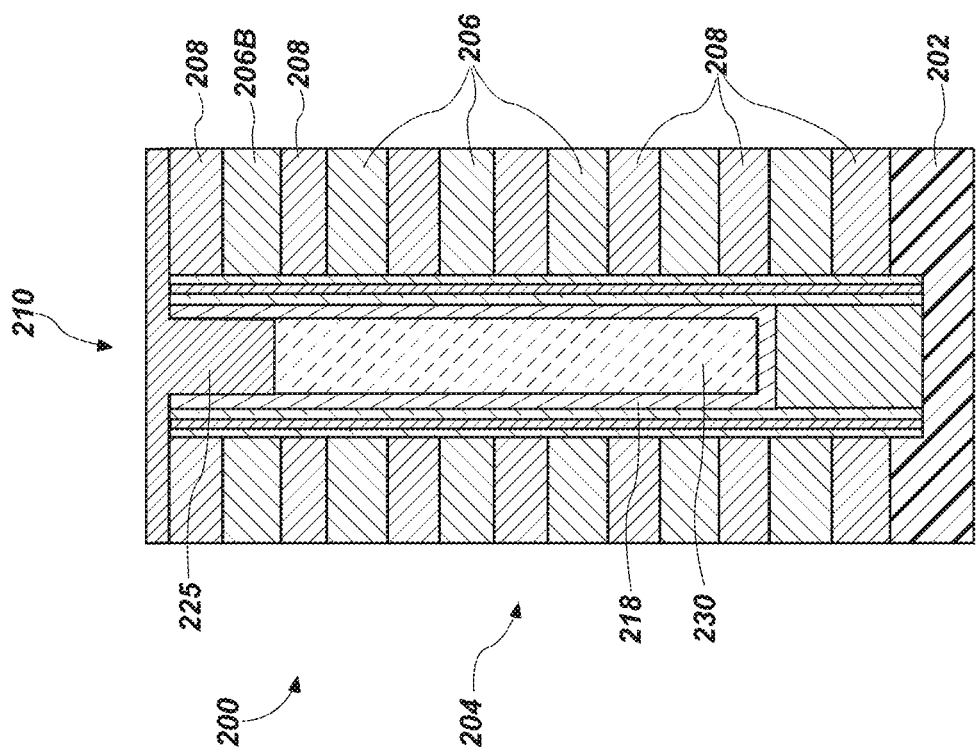
Figure 2A:
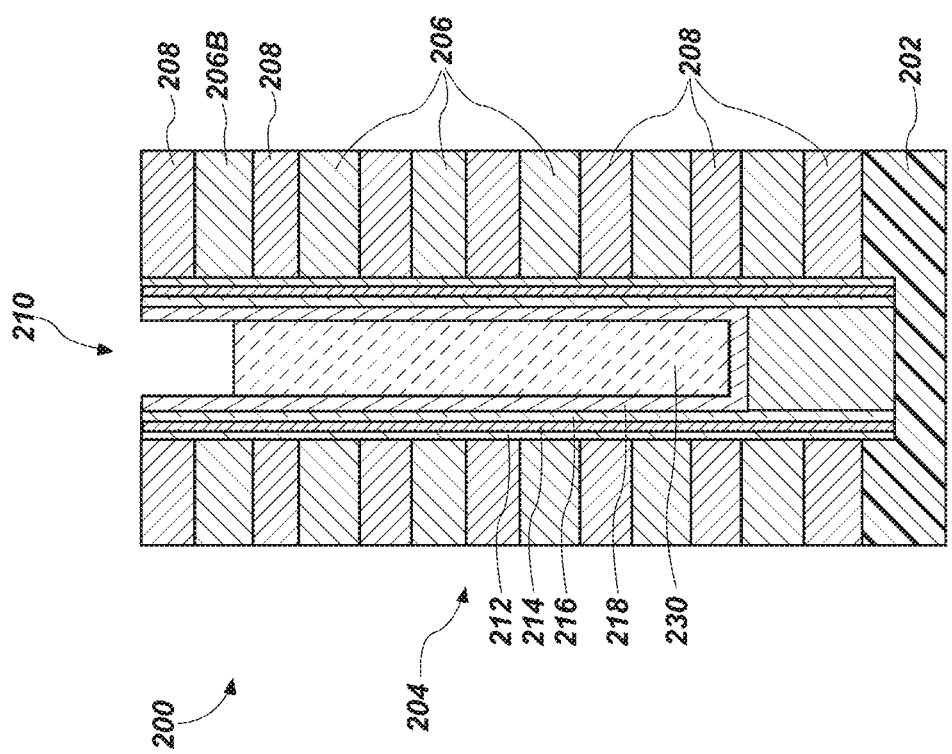

FIG. 2A illustrates a simplified partial cross-sectional view of a semiconductor device structure 200. At the processing stage depicted in FIG. 2A the semiconductor device structure 200 may be substantially similar to the semiconductor device structure 100 at the processing stage depicted in FIG. 1A.

Referring to FIG. 2B, a band offset material 225 may be formed (e.g., non-conformally formed) over exposed surfaces of the semiconductor device structure 200 inside and outside of the opening 210 vertically extending through the stack 204 overlying a substrate 202. The band offset material 225 may directly physically contact the channel material 218. The band offset material 225 may include substantially the same materials, properties, and band gap as the band offset material 125 described above with reference to FIG. 1B. In some embodiments, the band offset material 225 may be epitaxially grown within the opening 210. The band offset material 225 may substantially completely fill a remainder of the opening 210 (e.g., a cylindrical opening) so as to fully laterally extend between internal sidewalls of the channel material 218 within the opening 210.

Referring to FIG. 2C, the band offset material 225 may be vertically recessed. Portions of the band offset material 225 on uppermost surfaces of the stack 204, the outer oxide liner 112, the nitride liner 114, and the inner oxide liner 116 may be removed, and the band offset material 225 may be vertically recessed within the opening 210. A remaining portion of the band offset material 225 within the opening 210 may be positioned such that a bottom surface thereof extends beyond a bottom surface of an uppermost conductive gate material 206B. In addition, an upper surface of the remaining portion of the band offset material 225 within the opening 210 may extend beyond an upper surface of the uppermost conductive gate material 206B. Put another way, the band offset material 225 may at least partially (e.g., substantially) vertically overlap the uppermost conductive gate material 206B.

Referring to FIG. 2D, a top plug material 224 may be formed over the band offset material 225 within the opening 210 and may be electrically coupled to the channel material 218. The top plug material 224 may include substantially the same materials and properties (e.g., band gap) as the top plug material 124 described above with reference to FIG. 1D, but the top plug material 224 may not extend to an upper surface of the central dielectric material 230. Rather, the band offset material 225 may fully extend over the upper surface of the central dielectric material 230, and the top plug material 224 may be formed over an exposed upper surface of the band offset material 225. The top plug material 224 may be formed using processes (e.g., deposition and material removal processes) substantially similar to those previously described in relation to the formation of the top plug material 124 (FIG. 1D).

An uppermost conductive gate material 206B may have a vertical thickness TL that is greater than respective thicknesses of the other conductive gate materials 206, 206A of the stack 204, to provide a larger error margin when forming an extent of the top plug material 224 and/or portions of the top plug material 224 to at least partially vertically overlap the uppermost conductive gate material 206B. By way of example and not limitation, the vertical thickness TL of the uppermost conductive gate material 206B may be greater than or equal to about 45 nm, while the respective vertical thicknesses of the other conductive gate materials 206, 206A may be about 35 nm.

Figure 2E:
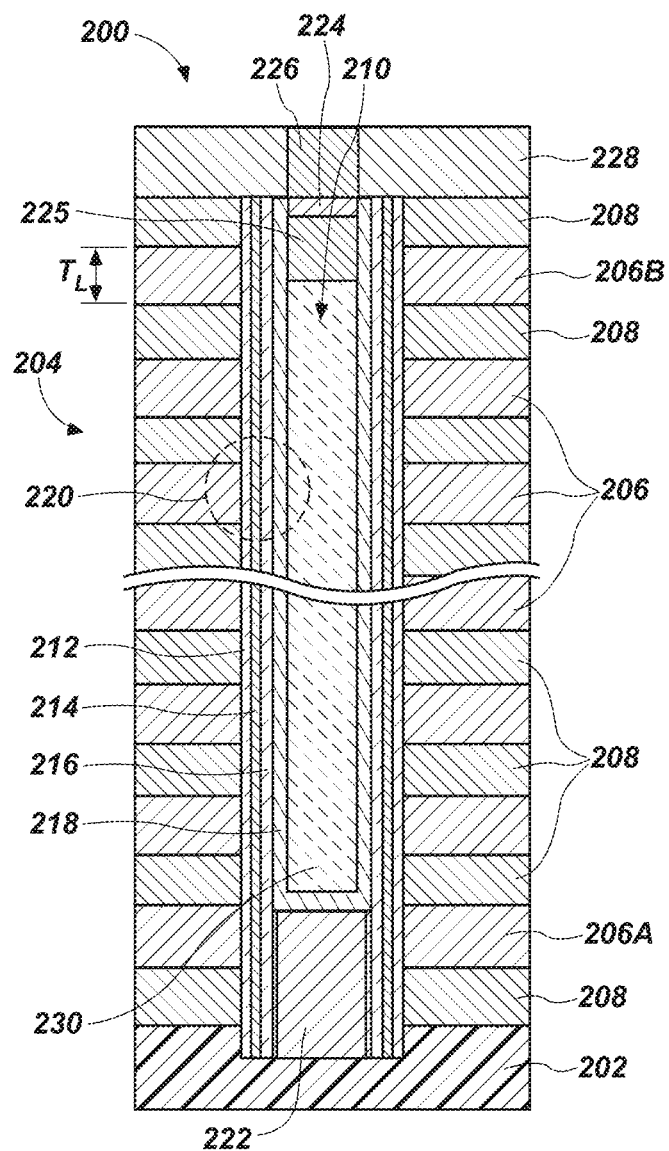

Referring to FIG. 2E, a cap dielectric material 228 may be formed on or over upper surfaces of the stack 204, the outer oxide liner 212, the nitride liner 214, and the inner oxide liner 216; and a data line 226 (e.g., bit line, digit line) may be formed on or over uppermost surfaces of the top plug material 224. The cap dielectric material 228 and the data line 226 may be substantially similar to and may be formed in substantially the same manner as the cap dielectric material 128 and the data line 126 previously described with reference to FIG. 1E.

Figure 3:
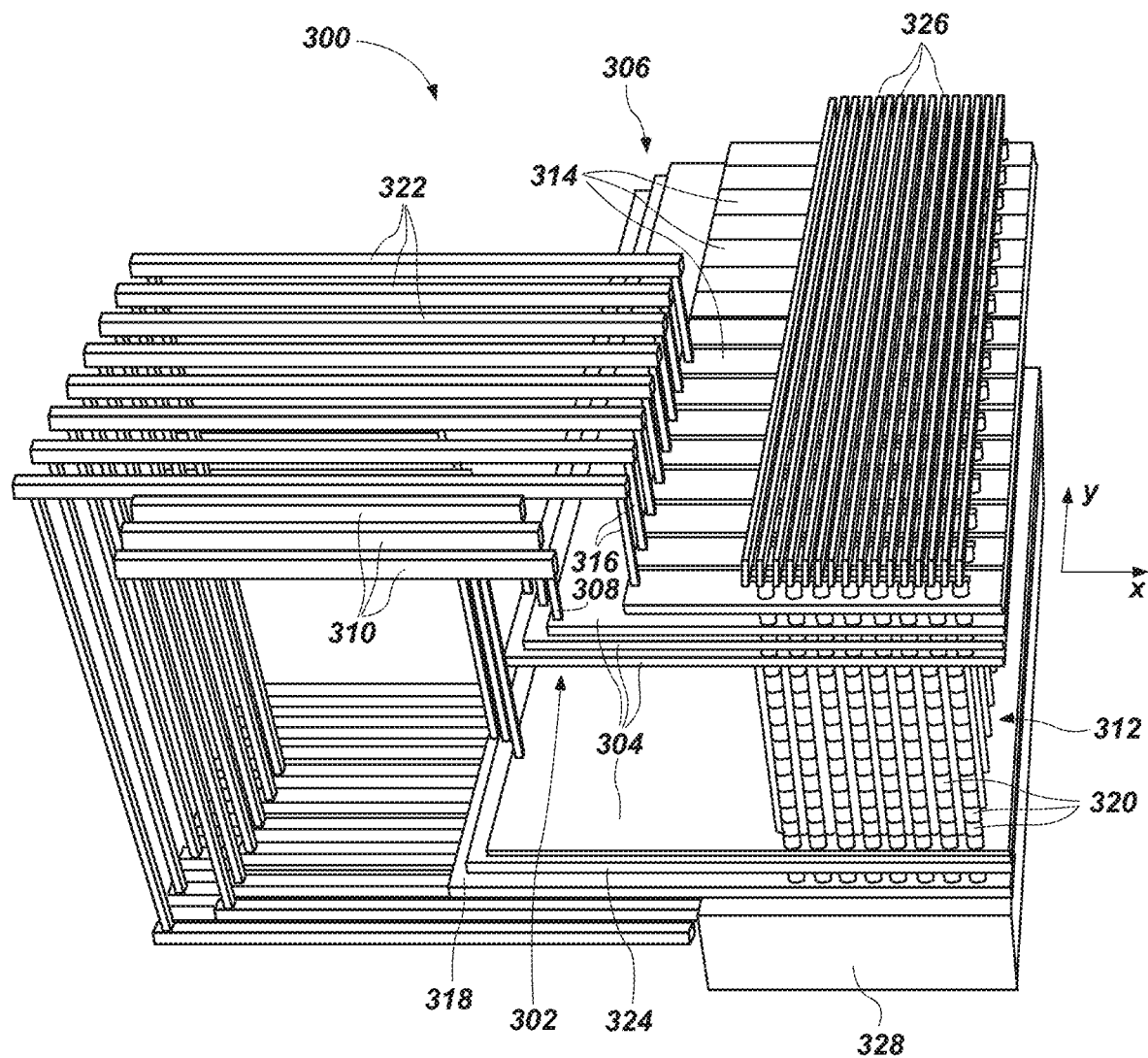
FIG. 3 is a partial cutaway perspective view of a vertical memory device including a semiconductor device structure having a stair step structure, in accordance with an embodiment of the disclosure.

FIG. 3 illustrates a partial cutaway perspective view of a portion of a semiconductor device 300 (e.g., a vertical memory device, such as a 3D NAND Flash memory device) including a semiconductor device structure 302 including tiers 304 of conductive structures and insulative structures defining a stair step structure 306, and contact structures 308 electrically connected to steps of the stair step structure 306. While a vertical memory device, such as the 3D NAND Flash memory device is shown by way of example, it will be understood by one of ordinary skill in the art that increasing the GIDL current with enhanced BTBT generation utilizing the band offset material 125 in combination with the top plug material 124 and the channel material 118 (FIG. 1F) does not depend on a particular storage media and that the band offset material 125 may be utilized in any such memory devices including similar materials and processes. In the present example, the semiconductor device structure 302 (e.g., including the tiers 304 of conductive structures and insulative structures, the stair step structure 306, and the contact structures 308) may be substantially similar to and may be formed in substantially the same manner as the semiconductor device structures 100, 200 (e.g., including tiers of the conductive gate materials 106, 206 and the dielectric materials 108, 208) previously described in with respect to FIGS. 1A-1E and 2A-2E, respectively. The semiconductor device 300 may further include vertical strings 312 of memory cells 320 (e.g., the memory cells 120, 220) coupled to each other in series, data lines 326 (e.g., bit lines), a source tier 318, access lines 310, first select gates 314 (e.g., upper select gates, drain select gates (SGDs)), select lines 322, a second select gate 324 (e.g., a lower select gate, a source select gate (SGS)), and additional contact structures 316. The vertical strings 312 of memory cells 320 extend vertically and orthogonal to conductive lines and tiers (e.g., the data lines 326, the source tier 318, the tiers 304 of the semiconductor device structure 302, the access lines 310, the first select gates 314, the select lines 322, the second select gate 324), and the contact structures 308 and the additional contact structures 316 may electrically couple components to each other as shown (e.g., the select lines 322 to the first select gates 314, the access lines 310 to the tiers 304 of the semiconductor device structure 302). The semiconductor device 300 may also include a control unit 328, which may include one or more of string driver circuitry, pass gates, circuitry for selecting gates, circuitry for selecting conductive lines (e.g., the data lines 326, the access lines 310), circuitry for amplifying signals, and circuitry for sensing signals. The control unit 328 may, for example, be electrically coupled to the data lines 326, source tier 318, access lines 310, first select gates 314, and second select gate 324, for example.

Figure 4:
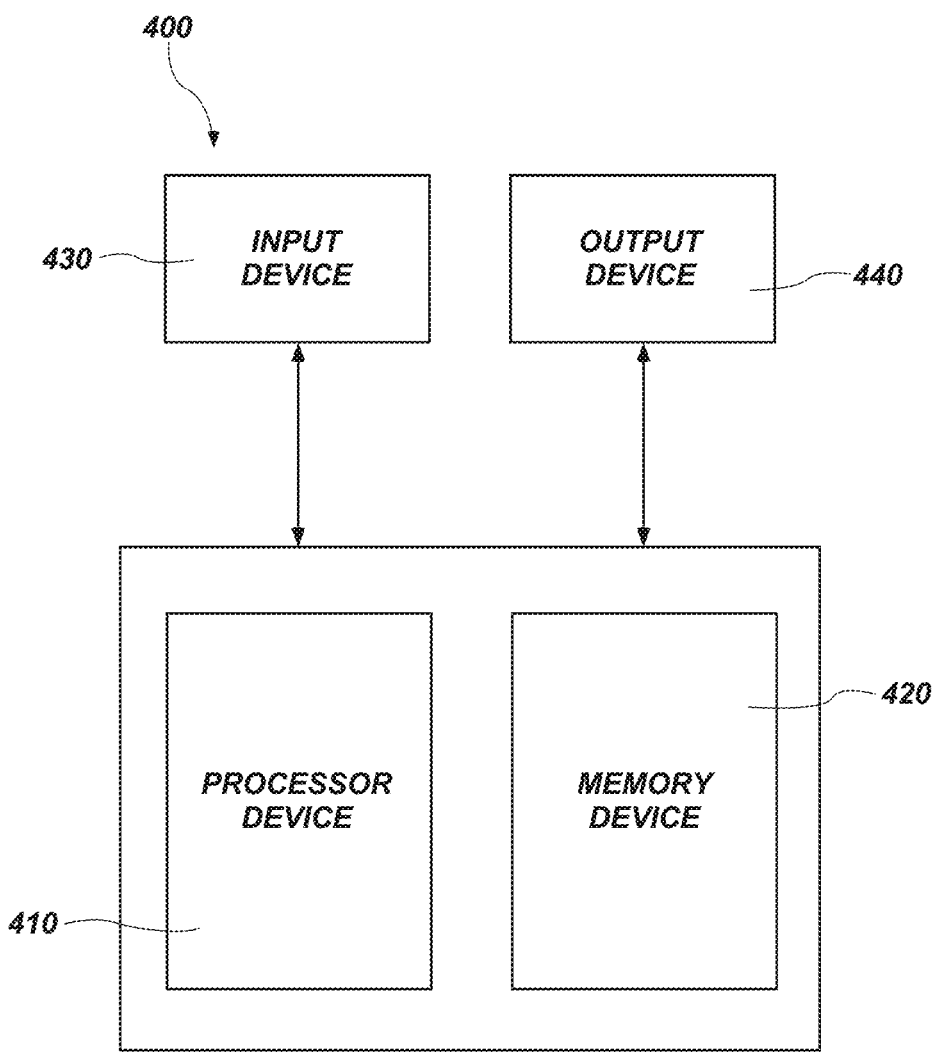
FIG. 4 is a schematic block diagram of an electronic system, in accordance with embodiments of the disclosure.

Semiconductor devices including device structures (e.g., the semiconductor device structures 100, 200) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 400 includes at least one memory device 420. The memory device 420 may include, for example, an embodiment of a semiconductor device previously described herein (e.g., semiconductor device structures 100, 200) previously described herein. The electronic system 400 may further include at least one electronic signal processor device 410 (often referred to as a "microprocessor"). The electronic signal processor device 410 may, optionally, include an embodiment of a semiconductor device previously described herein (e.g., the semiconductor device structures 100, 200). The electronic system 400 may further include one or more input devices 430 for inputting information into the electronic system 400 by a user, such as, for example, a mouse or other pointing device, a keyboard, a touchpad, a button, or a control panel. The electronic system 400 may further include one or more output devices 440 for outputting information (e.g., visual or audio output) to a user such as, for example, a monitor, a display, a printer, an audio output jack, a speaker, etc. In some embodiments, the input device 430 and the output device 440 may comprise a single touchscreen device that can be used both to input information to the electronic system 400 and to output visual information to a user. The input device 430 and the output device 440 may communicate electrically with one or more of the memory device 420 and the electronic signal processor device 410.

Thus, in accordance with embodiments of the disclosure, an electronic system including a semiconductor device comprises a processor, and a semiconductor device electrically coupled to the processor. The semiconductor device comprises vertical structures within openings vertically extending through a stack of vertically alternating conductive materials and dielectric materials. Each of the vertical structures comprises a channel material, plug material adjacent the channel material, and band offset material in direct contact with each of the channel material and the plug material. A band gap of the band offset material is different from that of each of the channel material and the plug material. The semiconductor device also comprises data lines above the openings vertically extending through the stack, and an uppermost conductive gate material laterally adjacent the opening. The plug material at least partially vertically overlaps the uppermost conductive gate material.

The band offset materials disclosed herein may provide enhanced current transmission in 3D memory arrays, which may be suitable for use with devices having an increased number of stacked transistors. The differing (e.g., smaller) band gap of the disclosed band offset materials may result in increased GIDL current values for improved string erase operations compared to only using conventional bitline plug materials, such as polysilicon. In addition, the band offset materials may be applicable to all 3D memory architectures including select gate source and select gate drain transistors.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. An apparatus, comprising:
   a semiconductive structure comprising channel material extending vertically through a stack of vertically alternating conductive materials and dielectric materials;
   a conductive line structure vertically overlying the semiconductive structure;
   a band offset structure directly physically contacting the semiconductive structure along a single, vertically extending inner surface of the semiconductive structure, the band offset structure comprising a material having a band gap different than an additional band gap of the semiconductive structure;
   a conductive plug structure directly physically contacting each of the semiconductive structure, the conductive line structure, and the band offset structure, the conductive plug structure directly physically contacting the channel material along a vertical interface therebetween; and
   dielectric material substantially laterally surrounded by the semiconductive structure, the dielectric material vertically underlying and directly physically contacting the band offset structure along a horizontal interface therebetween.

2. The apparatus of claim 1, wherein at least a portion of the conductive plug structure vertically intervenes between the conductive line structure and the band offset structure.

3. An apparatus, comprising:
   a semiconductive structure comprising channel material extending vertically through a stack of vertically alternating conductive materials and dielectric materials;
   a conductive line structure vertically overlying the semiconductive structure;
   a band offset structure directly physically contacting the semiconductive structure along a single, vertically extending inner surface of the semiconductive structure, the band offset structure comprising a material having a band gap different than an additional band gap of the semiconductive structure;
   a conductive plug structure directly physically contacting each of the semiconductive structure, the conductive line structure, and the band offset structure, an upper boundary of the band offset structure vertically underlying upper boundaries of the semiconductive structure and the conductive plug structure; and
   dielectric material substantially laterally surrounded by the semiconductive structure, the dielectric material vertically underlying and directly physically contacting the band offset structure along a horizontal interface therebetween.

4. The apparatus of claim 1, wherein horizontal centers of the band offset structure and the conductive plug structure are substantially aligned with a horizontal center of the dielectric material.

5. The apparatus of claim 1, wherein the band offset structure vertically intervenes between at least a portion of the conductive plug structure and the dielectric material.

6. The apparatus of claim 1, wherein an upper boundary of the band offset structure is substantially coplanar with a lowermost surface of the conductive plug structure, the band offset structure directly contacting an upper surface of the dielectric material.

7. The apparatus of claim 1, wherein the band offset structure directly physically contacts the dielectric material along a horizontal extent of the band offset structure.

8. An apparatus, comprising:
- a semiconductive structure comprising channel material extending vertically through a stack of vertically alternating conductive materials and dielectric materials;
- a conductive line structure vertically overlying the semiconductive structure;
- a band offset structure directly physically contacting the semiconductive structure along a single, vertically extending inner surface of the semiconductive structure, the band offset structure comprising a material having a band gap different than an additional band gap of the semiconductive structure;
- a conductive plug structure directly physically contacting each of the semiconductive structure, the conductive line structure, and the band offset structure, a portion of the conductive plug structure horizontally adjacent to and substantially surrounded by the band offset structure; and
- dielectric material substantially laterally surrounded by the semiconductive structure, the dielectric material vertically underlying and directly physically contacting the band offset structure along a horizontal interface therebetween.

9. The apparatus of claim 1, wherein a portion of the conductive plug structure directly physically contacts the dielectric material along a horizontal interface therebetween.

10. An apparatus, comprising:
- a stack structure comprising tiers each including insulative material and conductive material vertically neighboring the insulative material;
- a channel structure extending vertically through the stack structure;
- a conductive plug structure directly laterally adjacent to and substantially surrounded by the channel structure; and
- a band offset structure directly laterally adjacent to and substantially surrounded by the channel structure, an upper boundary of the band offset structure vertically recessed relative to upper boundaries of each of the channel structure and the conductive plug structure, the band offset structure comprising a material exhibiting a band gap that differs from individual band gaps of materials of the channel structure and the conductive plug structure.

11. The apparatus of claim 10, further comprising a data line vertically adjacent to and directly physically contacting the conductive plug structure, the data line isolated from the band offset structure by the conductive plug structure.

12. The apparatus of claim 10, wherein an uppermost conductive material of the stack structure comprises a select gate structure, a lower boundary of the conductive plug structure vertically elevated relative to an upper boundary of the select gate structure.

13. The apparatus of claim 10, wherein a radial extent of the band offset structure is substantially the same as a radial extent of the conductive plug structure, a height of the band offset structure relatively greater than a height of the conductive plug structure.

14. The apparatus of claim 10, wherein the band offset structure comprises an epitaxial plug and the conductive plug structure comprises one or more of silicon germanium and germanium directly on an upper surface of the epitaxial plug.

15. A memory device, comprising:
- a conductive line overlying a stack of vertically alternating conductive materials and dielectric materials;
- conductive plug material directly physically contacting the conductive line;
- band offset material directly physically contacting the conductive plug material;
- channel material vertically extending through the stack, the channel material directly physically contacting and substantially surrounding each of the conductive plug material and the band offset material, the channel material having a band gap different than a band gap of the band offset material; and
- an oxide-nitride-oxide material horizontally adjacent to and substantially surrounding the channel material, an upper surface of the oxide-nitride-oxide material extending beyond an upper boundary of the band offset material.

16. The memory device of claim 15, wherein a first dopant concentration of the conductive plug material is relatively greater than each of a second dopant concentration of the band offset material and a third dopant concentration of the channel material.

17. The memory device of claim 15, wherein the conductive line is electrically coupled to the conductive plug material, without being electrically coupled to the band offset material.

18. The memory device of claim 15, wherein the channel material comprises a single semiconductive material in communication with the band offset material along a vertical extent of the band offset material.

* * * * *